United States Patent
Choi et al.

(10) Patent No.: US 10,333,002 B2
(45) Date of Patent: Jun. 25, 2019

(54) THIN FILM TRANSISTOR AND MANUFACTURING METHOD THEREOF, ARRAY SUBSTRATE AND MANUFACTURING METHOD THEREOF, AND DISPLAY DEVICE

(71) Applicant: BOE Technology Group Co., Ltd., Beijing (CN)

(72) Inventors: Seungjin Choi, Beijing (CN); Jaehong Kim, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 21 days.

(21) Appl. No.: 15/518,973

(22) PCT Filed: Dec. 29, 2015

(86) PCT No.: PCT/CN2015/099336
§ 371 (c)(1),
(2) Date: Apr. 13, 2017

(87) PCT Pub. No.: WO2017/028455
PCT Pub. Date: Feb. 23, 2017

(65) Prior Publication Data
US 2017/0229571 A1    Aug. 10, 2017

(30) Foreign Application Priority Data
Aug. 20, 2015   (CN) .......................... 2015 1 0516319

(51) Int. Cl.
*H01L 21/02*  (2006.01)
*H01L 27/02*  (2006.01)
(Continued)

(52) U.S. Cl.
CPC ........ *H01L 29/786* (2013.01); *H01L 21/0226* (2013.01); *H01L 27/0288* (2013.01);
(Continued)

(58) Field of Classification Search
CPC ............... H01L 27/326; H01L 27/3276; H01L 27/3258; G09G 3/3266
See application file for complete search history.

(56) References Cited

U.S. PATENT DOCUMENTS 9,495,633 B2 * 11/2016 Davis .................... G06F 21/564
2010/0321840 A1 * 12/2010 Bobde ................ H01L 27/0266
361/56
(Continued)

FOREIGN PATENT DOCUMENTS

| CN | 102569413 A | 7/2012 |
| CN | 102646633 A | 8/2012 |

(Continued)

OTHER PUBLICATIONS

May 24, 2016—(WO) International Search Report Appn PCT/CN2015/099336 with English Tran.
(Continued)

*Primary Examiner* — Changhyun Yi
(74) *Attorney, Agent, or Firm* — Banner & Witcoff, Ltd.

(57) ABSTRACT

Provided are a thin film transistor and manufacturing method thereof, array substrate and manufacturing method thereof, and display device. The thin film transistor comprises: an active layer, an etch stop layer disposed on the active layer, an overcoating layer disposed on the etch stop layer, and a source electrode and a drain electrode disposed on the overcoating layer, wherein the overcoating layer comprises at least one of a conductive material layer, a non-transparent insulation layer and a non-transparent semiconductor layer, and the source electrode and the drain electrode are electrically connected with the active layer.

19 Claims, 5 Drawing Sheets

(51) Int. Cl.
  *H01L 29/06* (2006.01)
  *H01L 29/49* (2006.01)
  *H01L 29/66* (2006.01)
  *H01L 29/417* (2006.01)
  *H01L 29/786* (2006.01)

(52) U.S. Cl.
  CPC .......... *H01L 29/06* (2013.01); *H01L 29/0607* (2013.01); *H01L 29/41733* (2013.01); *H01L 29/4908* (2013.01); *H01L 29/66969* (2013.01); *H01L 29/7869* (2013.01)

(56) References Cited

U.S. PATENT DOCUMENTS

| | | | |
|---|---|---|---|
| 2013/0134425 A1 | 5/2013 | Chung et al. | |
| 2013/0313546 A1 | 11/2013 | Yu | |
| 2015/0123084 A1* | 5/2015 | Kim | H01L 27/326 257/40 |
| 2015/0280002 A1* | 10/2015 | Lu | H01L 29/7869 257/43 |
| 2016/0343742 A1 | 11/2016 | Huang | |
| 2016/0372603 A1 | 12/2016 | Liu et al. | |
| 2017/0098669 A1* | 4/2017 | Tsuno | H01L 27/1255 |

FOREIGN PATENT DOCUMENTS

| | | |
|---|---|---|
| CN | 103915444 A | 7/2014 |
| CN | 104377247 A | 2/2015 |
| CN | 104600123 A | 5/2015 |
| CN | 105161519 A | 12/2015 |
| EP | 2800141 A1 | 11/2014 |
| JP | 3538088 B2 | 6/2004 |

OTHER PUBLICATIONS

Aug. 18, 2017—(CN) First Office Action Appn 201510516319.4 with English Tran.

Mar. 21, 2019—(EP) Supplementary European Search Report Appn 15901655.9.

* cited by examiner

THIN FILM TRANSISTOR AND MANUFACTURING METHOD THEREOF, ARRAY SUBSTRATE AND MANUFACTURING METHOD THEREOF, AND DISPLAY DEVICE

The application is a U.S. National Phase Entry of International Application No. PCT/CN2015/099336 filed on Dec. 29, 2015, designating the United States of America and claiming priority to Chinese Patent Application No. 201510516319.4, filed Aug. 20, 2015. The present application claims priority to and the benefit of the above-identified applications and the above-identified applications are incorporated by reference herein in their entirety.

TECHNICAL FIELD

Embodiments of the present disclosure relate to a thin film transistor and a manufacturing method thereof, an array substrate and a manufacturing method thereof, and a display device.

BACKGROUND

Generally, a display comprises an array substrate, thin film transistors (TFTs) are disposed on the array substrate and are arranged in a matrix, each of the TFTs functions as a switch to connect a data line with a pixel, the time period of turning-on and -off is controlled by a gate line. Taking a liquid crystal display as an example, the array substrate of the liquid crystal display comprises a plurality of gate lines and a plurality of data lines intercrossing vertically and longitudinally with each other. The gate lines and the data lines define a plurality of pixel units, for instance, each pixel unit comprises a TFT and a pixel electrode, for instance, a gate electrode of the TFT is electrically connected with the gate line, a source electrode of the TFT is electrically connected with the data line, and a drain electrode of the TFT is electrically connected with the pixel electrode.

At present, a metal oxide TFT attracts wide attention due to the advantages such as high carrier mobility, good homogeneity, transparency, simple manufacturing process and etc. An etch stop metal oxide TFT is a common type of metal oxide TFT, the manufacturing process thereof is simple, an etch stop layer formed on a metal oxide active layer can protect the metal oxide active layer from being damaged in the procedure of forming source/drain electrodes, so as to improve performance of the metal oxide TFT.

According to a position relationship between the gate electrode and the active layer, the metal oxide TFT can comprise a bottom-gate structure and a top-gate structure, namely, in the bottom-gate structure, the gate electrode is located under the active layer, in the top-gate structure, and the gate electrode is located on the active layer. In addition, in the top-gate structure, a light-shading metal layer is disposed under the metal oxide active layer to protect the metal oxide active layer from light.

SUMMARY

Embodiments of the present disclosure provide a thin film transistor and a manufacturing method thereof, an array substrate and a manufacturing method thereof, and a display device, so as to reduce damage caused by ESD (Electro-Static Discharge) occurring at positions where the active layer is to be electrically connected with the source/drain electrodes.

At least one embodiment of the present disclosure provides a thin film transistor (TFT), comprising: an active layer; an etch stop layer disposed on the active layer; an overcoating layer disposed on the etch stop layer, wherein the overcoating layer comprises at least one of a conductive material layer, a non-transparent insulation layer and a non-transparent semiconductor layer; and a source electrode and a drain electrode disposed on the overcoating layer, wherein the source electrode and the drain electrode are electrically connected with the active layer.

At least one embodiment of the present disclosure further provides an array substrate, comprising the above mentioned TFT.

At least one embodiment of the present disclosure further provides a display device, comprising the above mentioned array substrate.

At least one embodiment of the present disclosure further provides a method for manufacturing a thin film transistor, the method comprises: forming an active layer; forming an etch stop layer, wherein the etch stop layer is formed on the active layer; forming an overcoating layer, wherein the overcoating layer is formed on the etch stop layer and comprises at least one of a conductive material layer, a non-transparent insulation layer and a non-transparent semiconductor layer; and forming a source electrode and a drain electrode, wherein the source electrode and the drain electrode are formed on the overcoating layer and are electrically connected with the active layer.

At least one embodiment of the present disclosure further provides a method for manufacturing an array substrate, wherein the array substrate comprises a thin film transistor, and the thin film transistor is formed by the above mentioned method.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1b is a schematic view of the exposure process in manufacturing an etch stop layer of the TFT as illustrated in FIG. 1a;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
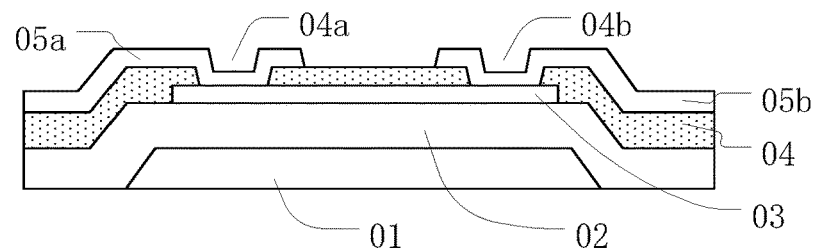
FIG. 1a is a schematic view of a cross-section of a bottom-gate metal oxide TFT.

FIG. 1a is a schematic view of a cross-section of a bottom-gate metal oxide TFT. As illustrated in FIG. 1a, the TFT comprises a gate electrode 01, a gate insulation layer 02 disposed on the gate electrode 01, a metal oxide (e.g., indium gallium zinc oxide) active layer 03 disposed on the gate insulation layer 02, an etch stop layer 04 disposed on the metal oxide active layer 03, and a source electrode 05a and a drain electrode 05b disposed on the etch stop layer 04; the source electrode 05a and the drain electrode 05b are respectively electrically connected with the metal oxide active layer 03 through a via hole 04a and a via hole 04b in the etch stop layer 04.

Generally, a method for manufacturing the TFT as illustrated in FIG. 1a comprises the following steps S01 to S05 and the steps will be described in details hereinafter.

Step S01: depositing a gate metal layer thin film, and forming a gate electrode 01 by a patterning process.

Step S02: depositing a gate insulation layer thin film on the gate electrode 01, and forming a gate insulation layer 02 and a via hole (not illustrated in FIG. 1a) in the gate insulation layer 02 by a patterning process.

Step S03: depositing a metal oxide thin film on the gate insulation layer 02, and forming a metal oxide active layer 03 by a patterning process.

Step S04: depositing an etch stop layer thin film on the metal oxide active layer 03, and forming an etch stop layer 04 and a via hole 04a and a via hole 04b in the etch stop layer 04 by a patterning process.

Step S05: depositing a source/drain metal layer thin film on the etch stop layer 04, and forming a source 05a and a drain electrode 05b by a patterning process, so as to make the source 05a and the drain electrode 05b be respectively electrically connected with the metal oxide active layer 03 through the via hole 04a and the via hole 04b.

Figure 1B:
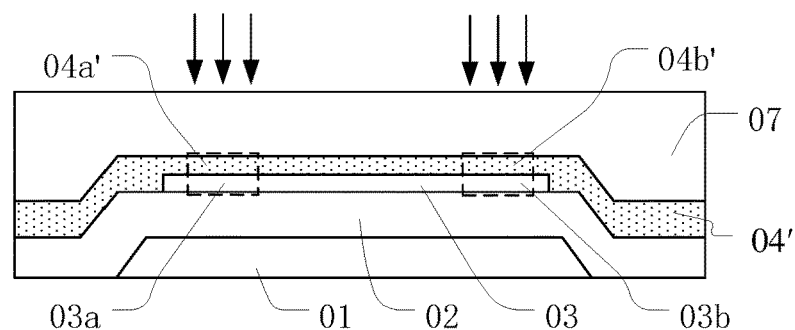

In research, the inventor of the present application have noted that, in Step S04, the patterning process of the etch stop layer thin film usually comprises: as illustrated in FIG. 1b, exposing a photoresist layer 07 formed on the etch stop layer thin film 04', wherein the exposure position corresponds to the positions 04a' and 04b' (as illustrated in dotted line in FIG. 1b) where the via hole 04a and the via hole 04b are to be correspondingly formed in the etch stop layer thin film 04'; after that, forming the etch stop layer 04 and the via hole 04a and the via hole 04b in the etch stop layer 04 by steps such as development, etching, and etc.

Figure 1C:
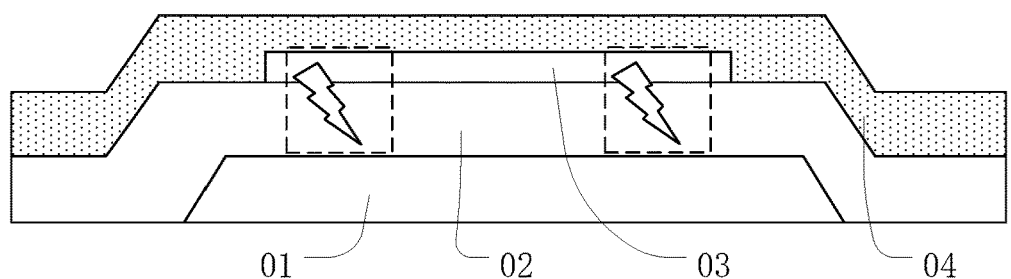
FIG. 1c is a schematic view showing ESD occurs in the exposure process of a patterning process of an etch stop layer thin film.

Because the etch stop layer thin film 04' is usually made of a material such as silicon oxide, light can irradiate to the metal oxide active layer 03 through the etch stop layer thin film 04' in process of exposing the photoresist 07, which leads to greatly increased probability of occurring electrostatic discharge (ESD, as illustrated in FIG. 1c) at positions where the metal oxide active layer 03 is to be electrically connected with the source electrode and the drain electrode. That is because: in the exposure process, portions (i.e., a first portion 03a and a second portion 03b, as illustrated by the dotted lines in FIG. 1b) where the metal oxide active layer 03 is to be electrically connected with the source electrode and the drain electrode are irradiated by light, so the probability that the portions become conductive greatly increases, which easily leads to capacitance between the metal oxide active layer 03 and the gate electrode 01 at the positions of the first portion 03a and the second portion 03b, and the capacitance can greatly increase the probability of ESD occurring. ESD easily leads to a short circuit between the gate electrode 01 under the metal oxide active layer 03 and the source/drain electrodes 05a, 05b above the metal oxide active layer 03.

At least one embodiment of the present disclosure provides a thin film transistor (TFT) and a manufacturing method thereof, an array substrate and a manufacturing method thereof, and a display device. In the TFT, an overcoating layer is disposed on an etch stop layer which is disposed on an active layer, the overcoating layer comprises at least one of a conductive material layer, a non-transparent insulation layer and a non-transparent semiconductor layer. In the exposure process of a patterning process of forming the etch stop layer and via holes thereof, even if ESD occurs at the positions where the active layer is to be electrically connected with the source/drain electrodes, the conductive material layer can also play a role of dispersing electrical current, so as to avoid occurring of ESD at the positions where the active layer is to be electrically connected with the source/drain electrodes and avoid leading to a short circuit between a metal layer under the active layer and a source/drain metal layer above the active layer; the non-transparent insulation layer or the non-transparent semiconductor layer can prevent a portion, where the active layer is to be electrically connected with the source/drain electrodes, from becoming a conductor due to light irradiation, so as to reduce the probability of ESD occurring at the positions where the active layer is to be electrically connected with the source/drain electrodes, and then to try to prevent the short circuit between the metal layer under the active layer and the source/drain metal layer above the active layer from occurring.

Embodiment 1

Figure 2A:
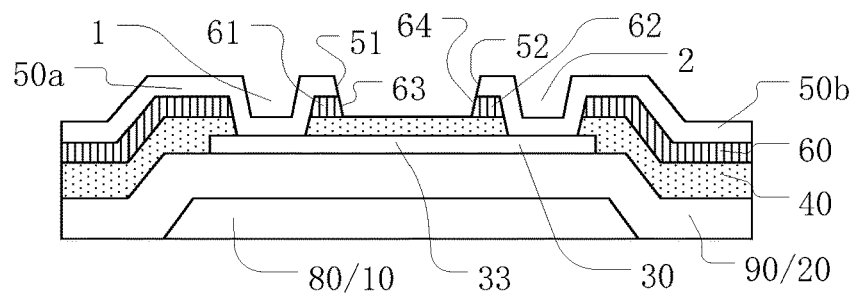
FIG. 2a is a schematic view of a cross-section of a TFT provided by a first embodiment of the present disclosure.
Figure 2B:
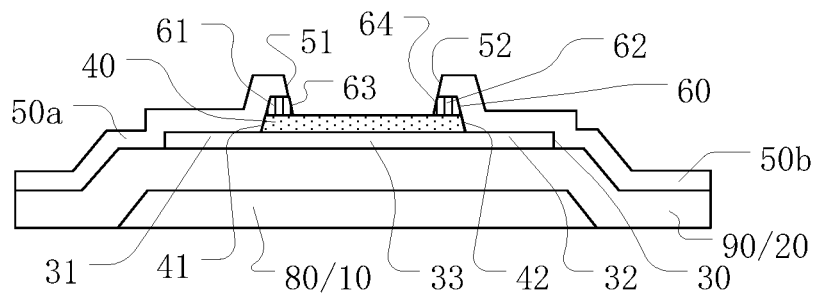
FIG. 2b is a schematic view of a cross-section of another TFT provided by the first embodiment of the present disclosure.
Figure 2C:
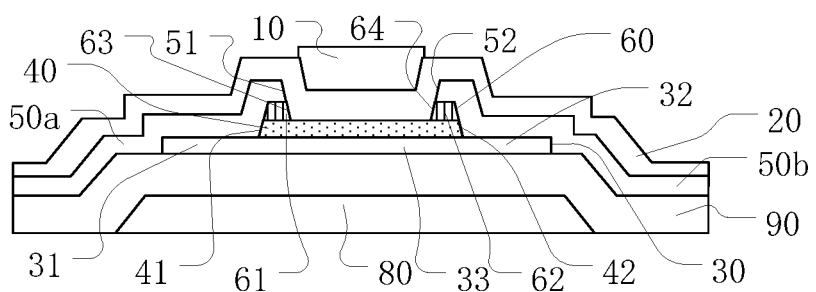
FIG. 2c is a schematic view of a cross-section of another TFT provided by the first embodiment of the present disclosure.

The present embodiment provides a TFT, as illustrated in FIGS. 2a to 2c, the TFT comprises: an active layer 30; an etch stop layer 40 disposed on the active layer 30; an overcoating layer 60 disposed on the etch stop layer 40 (i.e., disposed on a side of the etch stop layer 40, which side is farther away from the active layer 30); and a source electrode 50a and a drain electrode 50b disposed on the overcoating layer 60 (i.e., disposed on one side of the overcoating layer 60, which side is farther away from the etch stop layer 40), and the source electrode 50a and the drain electrode 50b are electrically connected with the active layer 30. In the present embodiment, the overcoating layer 60 comprises a conductive material layer, namely a material of the overcoating layer 60 comprises a conductive material. Thus, in process of forming the etch stop layer by a patterning process, even if ESD occurs at positions where the active layer 30 is to be electrically connected with the source electrode 50a and the drain electrode 50b, the overcoating layer 60 also can disperse electrical current so as to reduce damage caused by ESD.

In at least one example, the conductive material layer can be disconnected at a position of a channel region 33 of the active layer 30. Because the overcoating layer 60 comprises the conductive material layer and the conductive material layer is disconnected at the position of the channel region 33 of the active layer 30, the source electrode 50a and the drain electrode 50b can be prevented from being electrically connected with each other through the conductive material layer, so as to form the channel region 33 in the active layer 30. The case that the overcoating layer 60 is the conductive material layer is taken as an example to describe the FIGS. 2a to 2c. As illustrated in FIGS. 2a to 2c, the overcoating layer 60 is disconnected at the position of the channel region 33 of the active layer 30. Certainly, in the present embodiment, the channel region 33 of the active layer 30 can also be formed by adopting other customary technical ways in the related field.

In at least one example, the material of the conductive material layer of the overcoating layer 60 can comprise a metal or a conductive metal oxide. For instance, the metal can comprise at least one or more metals selected from the group consisting of aluminum, copper, zirconium, molybdenum, titanium and so on. For instance, the conductive metal oxide can comprise at least one or more conductive metal oxides selected from the group consisting of indium gallium zinc oxide, indium tin oxide, indium zinc oxide and so on. Of course, the material of the conductive material layer of the overcoating layer also can be other conductive materials.

For instance, when the material of the conductive material layer comprises the metal, namely, in the case that the conductive material layer comprises a metal layer, the metal layer can have a thickness of 300-1000 Å. Thus light can be prevented from being irradiated to the active layer through the etch stop layer in the process of exposing the overcoating layer, which can further reduce the probability of occurring the ESD at positions where the active layer is to be electrically connected with the source electrode and the drain electrode.

In addition, the conductive material layer can be formed with the source electrode and the drain electrode by one patterning process regardless of whether the material of the conductive material layer comprises the metal or the metal oxide material, in the patterning process, the conductive material layer can be etched with a source/drain metal layer thin film which is to be formed the source electrode and the drain electrode at the same time, or the conductive material layer can be etched with the source electrode and the drain electrode as a mask, in this way, processes and masks can be saved. In this case, along a direction perpendicular to the overcoating layer, the edges of the conductive material layer at the position of the channel region of the active layer can be respectively roughly aligned with an edge of a side of the source electrode facing the drain electrode and an edge of a side of the drain electrode facing the source electrode.

For instance, as illustrated in FIGS. 2a to 2c, the overcoating layer 60 is the conductive material layer, along the direction perpendicular to the overcoating layer 60, an edge 63 of the overcoating layer 60 at the position of the channel region 33 of the active layer 30 can be roughly aligned with an edge 51 of a side of the source electrode 50a facing the drain electrode 50b, and an edge 64 can be roughly aligned with an edge 52 of a side of the drain electrode 50b facing the source electrode 50a. That is to say, the overcoating layer 60 can comprise a first portion 61 located between the source electrode 50a and the etch stop layer 40 and a second portion 62 located between the drain electrode 50b and the etch stop layer 40, the first portion 61 and the second portion 62 are both located between a position where the active layer 30 is electrically connected with the source electrode 50a and a position where the active layer 30 is electrically connected with the drain electrode 50b, and a distance between the first portion 61 and the second portion 62 is equal to a distance between the source electrode 50a and the drain electrode 50b. As an edge of the pattern formed by a patterning process of a thin film may not be completely perpendicular to a surface of the pattern, therefore, the term "equal" herein can refer to "roughly equal".

In at least one example, the source electrode 50a and the drain electrode 50b can be respectively electrically connected with the active layer 30 through via holes, as illustrated in FIG. 2a, the source electrode 50a can be electrically connected with the active layer 30 through a first via hole 1 penetrating through the etch stop layer 40, and the drain electrode 50b may be electrically connected with the active layer 30 through a second via hole 2 penetrating through the etch stop layer 40.

In at least one example, the source electrode 50a and the drain electrode 50b also may be electrically connected with the active layer 30 without passing through the via holes. For instance, as illustrated in FIGS. 2b and 2c, an orthographic projection of the etch stop layer 40 on a surface of the active layer 30 is located within a region where the active layer 30 is provided, the active layer 30 comprises a first portion 31 and a second portion 32 respectively extending beyond an edge 41 and an edge 42 of two sides of the etch stop layer 40, the first portion 31 and the second portion 32 are located outside the orthographic projection of the etch stop layer 40, and the source electrode 50a is electrically connected with the first portion 31 and the drain electrode 50b is electrically connected with the second portion 32.

In at least one example, a metal structure 80 is disposed under the active layer 30, an insulation layer 90 is disposed between the metal structure 80 and the active layer 30, and the portions of the active layer, where the active layer 30 are respectively electrically connected with the source electrode 50a and the drain electrode 50b, are overlapped with the metal structure 80 in a direction perpendicular to a surface of the metal structure 80.

For instance, in the case as illustrated in FIG. 2a, an orthographic projection of the first via hole 1 and an orthographic projection of the second via hole 2 on the surface of the metal structure 80 have overlapped portions with the metal structure 80.

For instance, in the case as illustrated in FIGS. 2b and 2c, in the TFT, the orthographic projection of the first portion 31 of the active layer 30 and an orthographic projection of the second portion 32 of the active layer 30 on the surface of the metal structure 80 both have the overlapped portions with the metal structure 80.

In at least one example, the TFT further comprises a gate electrode 10, as illustrated in FIGS. 2a and 2b, the gate electrode 10 can be located under the active layer 30, namely the TFT may be of a bottom-gate structure, in this case, the gate electrode 10 can function as the above mentioned metal structure 80, and a gate insulation layer 20 can function as the above mentioned insulation layer 90. Of course, the TFT provided by the present embodiment can also be of a top-gate structure. As illustrated in FIG. 2c, the gate electrode 10 can be located on the active layer, in this case, the metal structure 80 is disposed under the active layer 30, and the metal structure 80 can be of a light-shading metal layer to prevent the active layer 30 of the TFT from being irradiated by light.

Because the material of the active layer 30 comprises the metal oxide, portions of the active layer 30 where the active layer 30 is to be electrically connected with the source electrode and the drain electrode are irradiated by light, and the probability of the portions becoming a conductor greatly increases, which leads to greatly increase the probability of occurring ESD at the positions where the active layer 30 is to be electrically connected with the source/drain electrodes. Therefore, the present embodiment is particularly suitable for a TFT, in which a material of the active layer 30 comprises a metal oxide material. Of course, the material of the active layer 30 can also comprise other materials which easily suffers from serious ESD at positions where the active layer is to be electrically connected with the source/drain electrodes due to irradiate by light.

Because the material of the active layer 30 comprises the metal oxide, in order to avoid affecting performances of the active layer 30, a material of the insulation layer connected with the active layer 30 can comprise silicon oxide, for instance, the etch stop layer 40 and the gate insulation layer 20 in FIGS. 2a and 2b as well as the etch stop layer 40 and the insulation layer 90 in FIG. 2c all can be made of silicon oxide materials. Of course, the insulation layer 90 connected with the active layer 30 can also adopt other customary materials in the field.

Embodiment 2

Figure 3A:
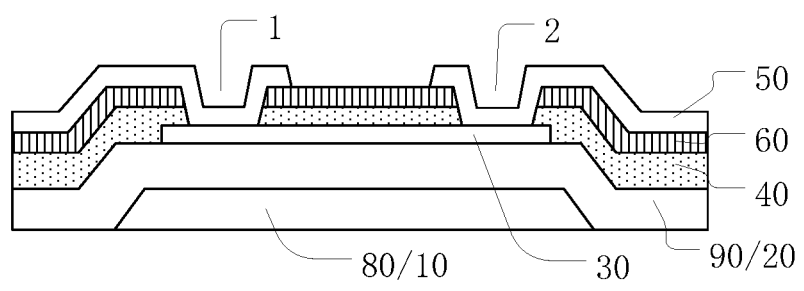
FIG. 3a is a schematic view of a cross-section of a TFT provided by a second embodiment of the present disclosure.
Figure 3B:
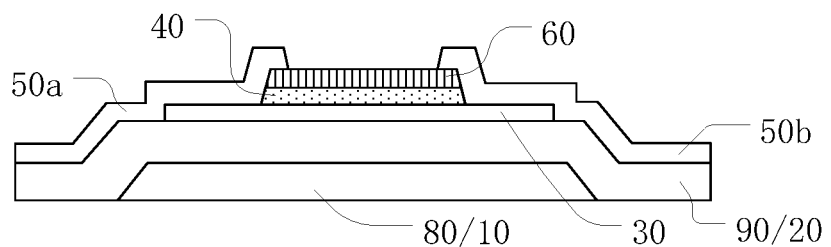
FIG. 3b is a schematic view of a cross-section of another TFT provided by the second embodiment of the present disclosure.
Figure 3C:
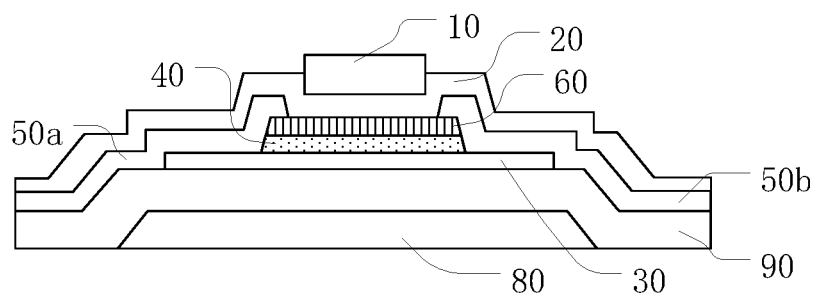
FIG. 3c is a schematic view of a cross-section of another TFT provided by the second embodiment of the present disclosure.

The difference between the TFT provided by the present embodiment and the TFT provided by embodiment 1 is that: in the present embodiment, the overcoating layer 60 is a non-transparent insulation layer, namely, a material of the overcoating layer 60 is non-transparent insulation material, as illustrated in FIGS. 3a to 3c.

Since the overcoating layer 60 is an insulation layer, it can be continuous at the channel region (not illustrated in figures) of the active layer 30. That is to say, the channel region of the active layer 30 can be formed without disconnecting the overcoating layer 60.

For instance, a material of the non-transparent insulation layer can be a black resin material. Of course, it also can be other customary non-transparent materials in the field.

The settings of each component of the TFT provided by the present embodiment can be referred to the relevant description of the embodiment 1, the repetition of which will not be elaborated here.

The overcoating layer is the conductive material layer, which is taken as an example to describe the above embodiment 1, and the overcoating layer is the non-transparent insulation layer, which is taken as an example to describe the above embodiment 2. When the overcoating layer is a non-transparent semiconductor layer, a material of the non-transparent semiconductor layer can adopt a customary material in the related field, for instance, silicon or other materials. Of course, those skilled in the related field can set a thickness of the non-transparent semiconductor layer according to needs, as long as the non-transparent semiconductor layer is non-transparent. In addition, in order to avoid electrically connecting the source electrode with the drain electrode through the overcoating layer, in the TFT provided by the present embodiment, the setting mode of the overcoating layer which is the non-transparent semiconductor layer can be similar to the setting mode of the overcoating layer of the TFT provided by embodiment 1, which will not be elaborated here.

Embodiment 3

As for the TFT provided by embodiment 1, such as, the TFT illustrated in FIGS. 2a to 2c, the present embodiment provides a method for manufacturing the TFT, and the method comprises: forming an active layer; forming an etch stop layer, wherein the etch stop layer is formed on the active layer; forming an overcoating layer, wherein the overcoating layer is formed on the etch stop layer and comprises a conductive material layer; and forming a source electrode and a drain electrode, wherein the source electrode and the drain electrode are formed on the overcoating layer and are electrically connected with the active layer.

For instance, forming of the etch stop layer and the overcoating layer can comprise the following steps S31 to S35, hereinafter these steps will be described in detail.

Step S31: forming an etch stop layer thin film which is formed on the active layer.

In this step, the etch stop layer thin film can be a thin film after patterning. For instance, the etch stop layer thin film can be formed with the active layer by a patterning process, that is to say, a film layer of the active layer material (such as a conductive metal oxide material) and a film layer of the etch stop layer material thereon can be formed, and then the two film layers can be patterned simultaneously to form the active layer and the above mentioned etch stop layer thin film.

Alternatively, the etch stop layer thin film can be a thin film that has not been patterned. That is to say, after forming the active layer, a film layer of the etch stop layer material formed on the active layer function as the etch stop layer thin film.

Step S32: forming an overcoating layer thin film on the etch stop layer thin film. For instance, a material of the overcoating layer thin film can comprises a metal or a conductive metal oxide.

Step S33: forming a photoresist thin film on the overcoating layer thin film, and forming a photoresist pattern after exposing and developing the photoresist thin film.

Step S34: etching the overcoating layer thin film with the photoresist pattern formed in the step S33 as a mask to form an overcoating layer pattern.

Step S35: etching the etch stop layer thin film with the photoresist pattern formed in step S33 or the overcoating layer pattern formed in step S34 as a mask to form the etch stop layer.

In at least one example, the source electrode and the drain electrode can be respectively electrically connected with the active layer through via holes in the etch stop layer. In this case, for instance, forming of the overcoating layer pattern in step S34 further comprises: forming a first overcoating layer via hole and a second overcoating layer via hole in the overcoating layer pattern; forming of the etch stop layer in step S35 further comprises: forming a first etch stop layer via hole corresponding to the first overcoating layer via hole and a second etch stop layer via hole corresponding to the second overcoating layer via hole in the etch stop layer. For instance, a first via hole is composed of the first overcoating layer via hole and the first etch stop layer via hole, a second via hole is composed of the second overcoating layer via hole and the second etch stop layer via hole, the source electrode is electrically connected with the active layer through the first via hole, and the drain electrode is electrically connected with the active layer through the second via hole.

Alternatively, in at least one example, the source electrode and the drain electrode also may be electrically connected with the active layer without passing through the via holes. In this case, for instance, in step S34, during forming the overcoating layer pattern, an orthographic projection of the overcoating layer pattern on a surface of the active layer is located in a region where the active layer is provided; in step S35, during forming the etch stop layer, an orthographic projection of the etch stop layer on the surface of the active layer is located in a region where the active layer is provided, and the active layer comprises a first portion and a second portion respectively extending beyond edges of two sides of the etch stop layer. In the following steps, the source electrode can be electrically connected with the first portion of the active layer, and the drain electrode can be electrically connected with the second portion of the active layer.

In the above example, the exposure position of the photoresist thin film can be adjusted, so as to form a plurality of via holes in the photoresist pattern or make an orthographic projection of the photoresist pattern on the surface of the active layer be located in a region where the active layer is provided, so that the overcoating layer pattern formed in step S34 also correspondingly has a via hole or an orthographic projection located in a region where the active layer is provided.

Since the overcoating layer comprises the conductive material layer, in order to form the channel region of the active layer, in the method for manufacturing the TFT provided by the present embodiment, forming of the source electrode and the drain electrode, for instance, can comprise steps S361 to S363, these steps are described in detail below.

Step S361: after forming the etch stop layer, forming a source/drain metal layer thin film on the overcoating layer pattern.

Step S362: patterning the source/drain metal layer thin film to form the source electrode and the drain electrode.

Step S363: etching the overcoating layer pattern to disconnect the overcoating layer pattern at a position between the source electrode and the drain electrode. It is to be noted that step S363 and step S362 can be carried out in process of the same above mentioned patterning.

For instance, as for the TFT illustrated in FIG. 2a, as illustrated in FIGS. 4a to 4f, the method provided by at least one example of the present embodiment can comprise the following steps S41 to S45, these steps are described in detail below.

Figure 4A:
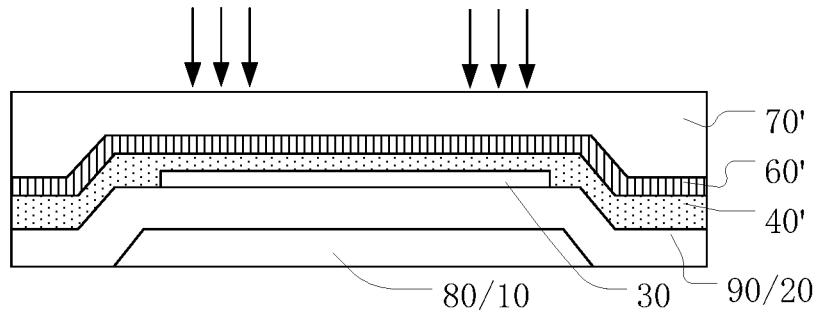
FIG. 4a to FIG. 4f are schematic views of steps of manufacturing a TFT as illustrated in FIG. 2a provided by a third embodiment of the present disclosure.

Step S41: forming an active layer 30, as illustrated in FIG. 4a.

For instance, firstly a thin film of the active layer material (such as a conductive metal oxide material) can be formed, and then the thin film is patterned to form the active layer 30.

Step S42: forming an etch stop layer thin film 40', wherein the etch stop layer thin film 40' is formed on the active layer 30, as illustrated in FIG. 4a.

The method for forming the etch stop layer thin film 40' can refer to the relevant description of step S31, the repetition will not be elaborated. The etch stop layer thin film 40' is formed after forming the active layer 30, which is taken as an example to describe the FIG. 4a. When the etch stop layer thin film 40' and the active layer 30 are formed by the same patterning process, an edge of the etch stop layer thin film 40' and an edge of the active layer 30 are roughly aligned.

Figure 4B:
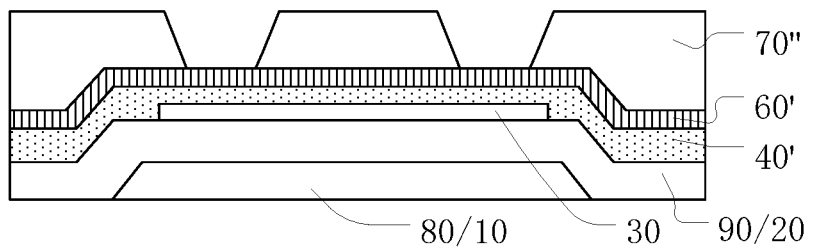
Figure 4C:
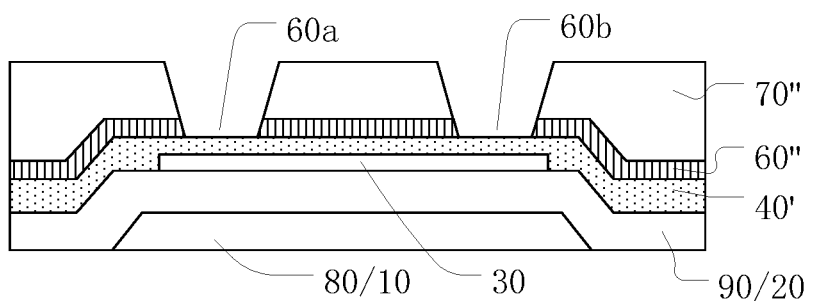

Step S43: forming an overcoating layer thin film 60' on the etch stop layer thin film 40', as illustrated in FIG. 4a; patterning the overcoating layer thin film 60' to form overcoating layer pattern 60" and a first overcoating layer via hole 60a and a second overcoating layer via hole 60b in the overcoating layer pattern 60", as illustrated in FIG. 4c.

For instance, patterning of the overcoating layer thin film 60' comprises forming a photoresist thin film 70', and exposing the photoresist thin film 70', the exposure position corresponds to a position where the active layer 30 is to be electrically connected with the source electrode and the drain electrode, as illustrated in FIG. 4a; then developing the photoresist thin film 70' to remove the photoresist irradiated by light, so as to form a photoresist pattern 70" and a plurality of photoresist via holes therein, as illustrated in FIG. 4b; and then etching the overcoating layer thin film 60' with the photoresist pattern 70" as a mask to forming the overcoating layer pattern 60" and the first overcoating layer via hole 60a and the second overcoating layer via hole 60b therein, as illustrated in FIG. 4c.

Figure 4D:
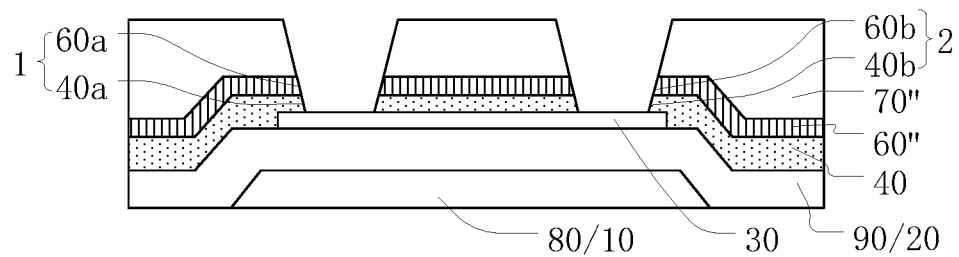

Step S44: etching the etch stop layer thin film 40' with the photoresist pattern 70" or the overcoating layer pattern 60" formed in the step S43 as a mask to form the etch stop layer 40 and a first etch stop layer via hole 40a corresponding to the first overcoating layer via hole 60a and a second etch stop layer via hole 40b corresponding to the second overcoating layer via hole 60b in the etch stop layer 40, and a first via hole 1 is composed of the first overcoating layer via hole 60a and the first etch stop layer via hole 40a, and a second via hole 2 is composed of the second overcoating layer via hole 60b and the second etch stop layer via hole 40b, as illustrated in FIG. 4d.

Figure 4E:
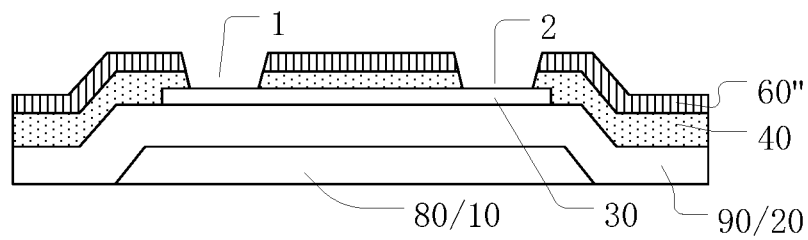

In the step, the photoresist pattern 70" on the overcoating layer pattern 60" can be removed after forming the etch stop layer 40, as illustrated in FIG. 4e.

Figure 4F:
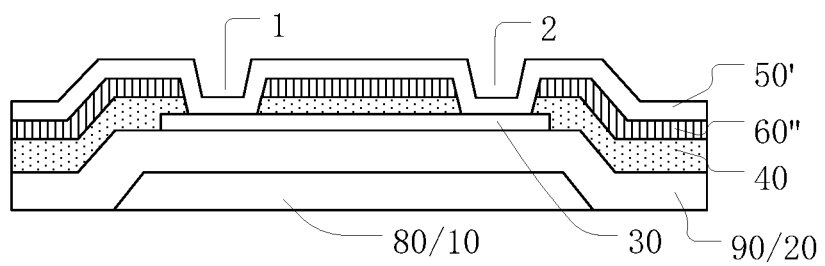

Step S45: forming a source/drain metal layer thin film 50' on the overcoating layer pattern 60", so that the first via hole 1 and the second via hole 2 is covered by the source/drain metal layer thin film 50', as illustrated in FIG. 4f; patterning the source/drain metal layer thin film 50' and the overcoating layer pattern 60" to form a source electrode 50a, a drain electrode 50b and an overcoating layer 60, wherein the source electrode 50a is electrically connected with the active layer 30 through the first via hole 1, the drain electrode 50b is electrically connected with the active layer 30 through the second via hole 2, and the overcoating layer 60 is disconnected at the position of the channel region 33 of the active layer 30, as illustrated in FIG. 2a.

As for the TFT illustrated in FIGS. 2b and 2c, as illustrated in FIGS. 5a to 5f, for instance, the method provided by at least one example of the present embodiment comprises the following steps S51 to S55, these steps are described in detail below.

Figure 5A:
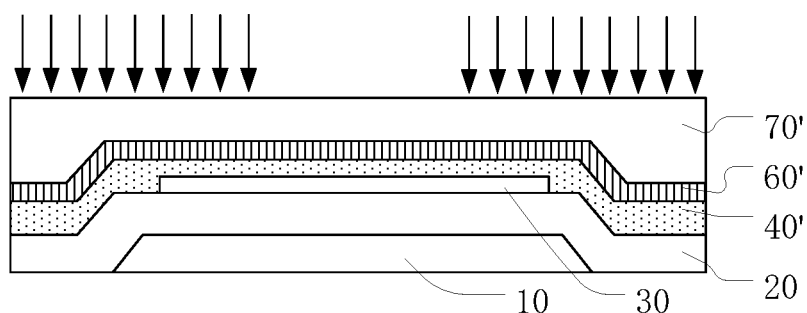
FIG. 5a to FIG. 5f are schematic views of steps of manufacturing a TFT as illustrated in FIG. 2b and FIG. 2c provided by the third embodiment of the present disclosure.

Step S51: forming an active layer 30, as illustrated in FIG. 5a.

Step S52: forming an etch stop layer thin film 40' on the active layer 30, as illustrated in FIG. 5a.

Figure 5B:
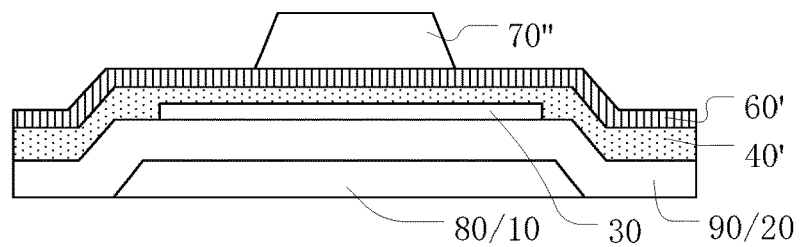
Figure 5C:
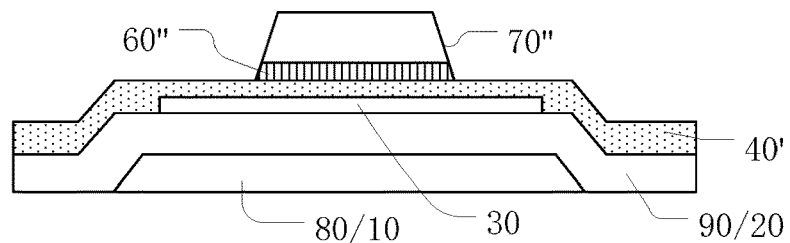

Step S53: forming an overcoating layer thin film 60' on the etch stop layer thin film 40', patterning the overcoating layer thin film 60' to form overcoating layer pattern 60", and an orthographic projection of the overcoating layer pattern 60" on a surface of the active layer 30 is located in a region where the active layer 30 is provided, as illustrated in FIG. 5c.

For instance, patterning of the overcoating layer thin film 60' comprises forming a photoresist thin film 70', and exposing the photoresist thin film 70', the non-exposure position corresponds to a portion of a channel region of the active layer 30, and the other portions are exposure positions, as illustrated in FIG. 5a; then developing the photoresist thin film 70' to remove the photoresist irradiated by light, so as to form a photoresist pattern 70", an orthographic projection of the photoresist pattern 70" on the surface of the active layer 30 is located in the region where the active layer 30 is provided, as illustrated in FIG. 5b; and then etching the overcoating layer thin film 60' with the photoresist pattern 70" as a mask to form the overcoating layer pattern 60", as illustrated in FIG. 5c.

Figure 5D:
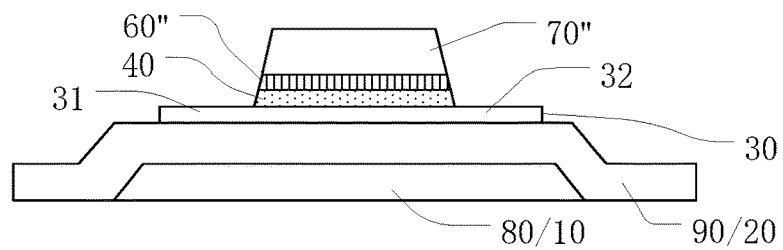

Step S54: etching the etch stop layer thin film 40' with the photoresist pattern 70" or the overcoating layer pattern 60" formed in the step S53 as a mask to form the etch stop layer 40, so that an orthographic projection of the etch stop layer 40 on the surface of the active layer 30 is located in the region where the active layer 30 is provided and the etch stop layer 40 comprises a first portion 31 and a second portion 32, which are located outside the orthographic projection of the etch stop layer 40, as illustrated in FIG. 5d.

Figure 5E:
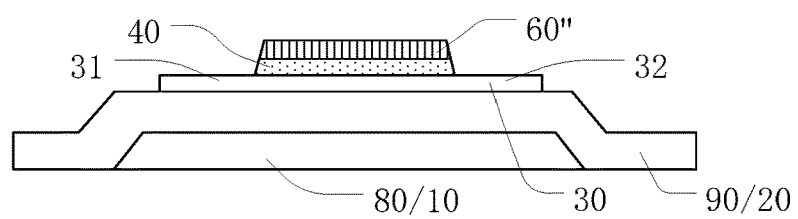

In this step, the photoresist pattern 70" on the overcoating layer pattern 60" can be removed after forming the etch stop layer 40, as illustrated in FIG. 5e.

Figure 5F:
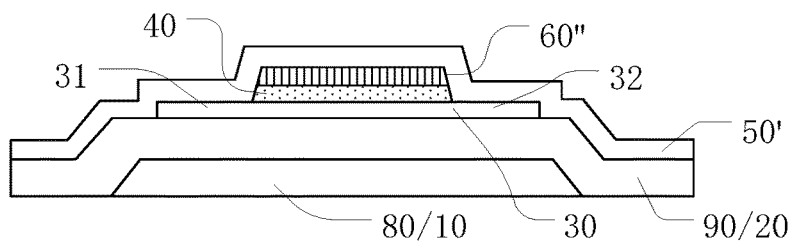

Step S55: forming a source/drain metal layer thin film 50' on the overcoating layer pattern 60", as illustrated in FIG. 5f; patterning the source/drain metal layer thin film 50' and the overcoating layer pattern 60" to form a source electrode 50a, a drain electrode 50b and an overcoating layer 60, wherein the source electrode 50a is electrically connected with the active layer 30 through the first portion 31 of the active layer 30, the drain electrode 50b is electrically connected with the active layer 30 through the second portion 32 of the active layer 30, and the overcoating layer 60 is disconnected at the position of the channel region 33 of the active layer 30, as illustrated in FIGS. 2b and 2c.

Of course, as for a bottom-gate structure TFT, for instance, the TFT illustrated in FIGS. 2a and 2b, the method thereof further comprises forming a gate electrode 10 and a gate insulation layer 20 on the gate electrode 10 before forming the active layer 30. As for a top-gate structure TFT, for instance, the TFT illustrated in FIG. 2c, the method thereof further comprises: forming a metal structure 80 and an insulation layer 90 on the metal structure 80 before forming the active layer 30, and after forming the source electrode 50a, the drain electrode 50b and the overcoating layer 60, and forming a gate insulation layer 20 and a gate electrode 10 which is located on the gate insulation layer 20 on the source electrode 50a and the drain electrode 50b.

Embodiment 4

As for the TFT provided by embodiment 2, for instance, the TFT illustrated in FIGS. 3a to 3c, the present embodiment provides another method for manufacturing the TFT, and the method comprises: forming an active layer; forming an etch stop layer, wherein the etch stop layer is formed on the active layer; forming an overcoating layer, wherein the overcoating layer is formed on the etch stop layer and is of a non-transparent insulation layer; and forming a source electrode and a drain electrode, wherein the source electrode and the drain electrode are formed on the overcoating layer and are electrically connected with the active layer.

The method provided by the present embodiment is similar to the method provided by embodiment 3, the difference is that: the portion of the overcoating layer corresponding to the channel region of the active layer may be not etched, that is to say, the overcoating layer can be continuous at the channel region of the active layer 30.

For instance, as for the TFT illustrated in FIG. 3a, the method provided by the present embodiment can comprise the above mentioned steps S41 to S45; and the overcoating layer pattern formed in step S43 is the overcoating layer, and the overcoating layer pattern may be not etched in step S45.

For instance, as for the TFT illustrated in FIGS. 3b and 3c, the method provided by the present embodiment can comprise the above mentioned steps S51 to S55; and the overcoating layer pattern formed in step S53 is the overcoating layer, and the overcoating layer pattern can be not etched in step S55.

The method provided by the present embodiment can refer to the relevant description of embodiment 3, and the repetition will not be elaborated.

Embodiment 5

The present embodiment provides an array substrate and a manufacturing method thereof.

The array substrate provided by the present embodiment comprises a TFT provided by the above mentioned embodiment 1 or embodiment 2.

For instance, the array substrate may be an array substrate for a liquid crystal display device. In this case, the array substrate further comprises a pixel electrode, the pixel electrode can be electrically connected with the drain electrode of the TFT. Of course, the array substrate can also be an Organic Light-Emitting Diode (OLED) array substrate or the like array substrates.

Because the TFT comprises an overcoating layer disposed on the etch stop layer, the overcoating layer comprises at least one of a conductive material layer and a non-transparent insulation layer; therefore during manufacturing the etch stop layer, the overcoating layer can disperse the current generating by ESD and/or play a role of preventing portions, where the active layer is to be electrically connected with the source/drain electrodes, from becoming conductors due to irradiation by light, therefore the overcoating layer can reduce damages caused by ESD, for instance, the overcoating layer can try to prevent a short circuit between the source/drain metal layer on the active layer and the metal layer under the active layer (for instance a gate metal layer) from occurring. The array substrate provided by the present embodiment comprises the TFT, and therefore the array substrate has similar effects.

In the method for manufacturing the array substrate provided by the present embodiment, the array substrate comprises a TFT, and the TFT is manufactured by the method provided by the above mentioned embodiment 3 or embodiment 4.

Of course, the method for manufacturing the array substrate further comprises forming other layers, for instance, the array substrate for the liquid crystal display further comprises forming a pixel electrode layer, for instance, the OLED array substrate further comprises forming an anode electrode layer, a cathode electrode layer and so on. The layers can be formed by customary methods in the related field, which the present embodiment will not elaborate.

In embodiment 3 to embodiment 5 above, the overcoating layer is the conductive material layer or the non-transparent insulation layer, which is taken as an example to describe the method for manufacturing the TFT and the method for manufacturing the array substrate. When the overcoating layer is a non-transparent semiconductor layer, the method for manufacturing the TFT and the array substrate are similar to embodiment 3, the method will not be elaborated here.

Embodiment 6

The present embodiment provides a display device, which comprises the array substrate provided by embodiment 5.

For instance, the display device can comprise an array substrate and an opposing substrate which are disposed opposite to each other, and the opposing substrate is a color filter substrate. In some examples, the display device further comprises a backlight source for providing the array substrate with backlight.

For instance, the display device can be a liquid crystal panel, an electronic paper, an OLED panel, a mobile phone, a tablet computer, a television, a monitor, a notebook computer, a digital photo frame, a GPS, or any product or components having any display function.

What are described above is related to the illustrative embodiments of the present disclosure only and not limitative to the scope of the disclosure; the scopes of the disclosure are defined by the accompanying claims.

The application claims priority to the Chinese patent application No. 201510516319.4, filed Aug. 20, 2015, the entire disclosure of which is incorporated herein by reference as part of the present application.

What is claimed is:

1. A thin film transistor, comprising:
an active layer;
an etch stop layer disposed on the active layer, the etch stop layer covering at least a portion of the active layer;
an overcoating layer disposed on the etch stop layer, the overcoating layer covering at least a portion of the etch stop layer, wherein the overcoating layer comprises at least one of a conductive material layer, a non-transparent insulation layer and a non-transparent semiconductor layer; and
a source electrode and a drain electrode disposed on the overcoating layer, the source electrode and the drain electrode covering at least a portion of the overcoating layer, wherein the source electrode and the drain electrode are electrically connected with the active layer by passing through the etch stop layer and the overcoating layer,
wherein the active layer comprises a channel region, and the overcoating layer is disconnected at a position of the channel region of the active layer, and along a direction perpendicular to the overcoating layer, edges of the overcoating layer at the position of the channel region are respectively aligned with an edge of a side of the source electrode facing the drain electrode and an edge of a side of the drain electrode facing the source electrode, so that the overcoating layer and the source electrode/drain electrode have a same profile at the position of the channel region.

2. The thin film transistor according to claim 1, wherein the overcoating layer comprises the conductive material layer or the non-transparent semiconductor layer.

3. The thin film transistor according to claim 2, wherein a material of the conductive material layer comprises a metal or a conductive metal oxide.

4. The thin film transistor according to claim 2, wherein the conductive material layer comprises a metal layer, and the metal layer has a thickness 300 Å-1000 Å.

5. The thin film transistor according to claim 2, wherein the source electrode is electrically connected with the active layer through a first via hole penetrating through the etch stop layer, and the drain electrode is electrically connected with the active layer through a second via hole penetrating through the etch stop layer; or
an orthographic projection of the etch stop layer on a surface of the active layer is located within a region where the active layer is provided, and the active layer comprises a first portion and a second portion respectively extending beyond edges of two sides of the etch stop layer, the source electrode is electrically connected with the first portion, and the drain electrode is electrically connected with the second portion.

6. The thin film transistor according to claim 5, wherein a metal structure is disposed under the active layer;
orthographic projections of the first via hole and the second via hole on a surface of the metal structure have an overlapped portion with the metal structure, or orthographic projections of the first portion and the second portion of the active layer on the surface of the metal structure both have overlapped portions with the metal structure.

7. The thin film transistor according to claim 6, further comprising a gate electrode,
wherein the gate electrode is located under the active layer, and the metal structure comprises the gate electrode; or
the gate electrode is located above the active layer, and the metal structure comprises a light-shading metal layer.

8. The thin film transistor according to claim 1, wherein the source electrode is electrically connected with the active layer through a first via hole penetrating through the etch stop layer, and the drain electrode is electrically connected with the active layer through a second via hole penetrating through the etch stop layer; or
an orthographic projection of the etch stop layer on a surface of the active layer is located within a region where the active layer is provided, and the active layer comprises a first portion and a second portion respectively extending beyond edges of two sides of the etch stop layer, the source electrode is electrically connected with the first portion, and the drain electrode is electrically connected with the second portion.

9. The thin film transistor according to claim 8, wherein a metal structure is disposed under the active layer;
orthographic projections of the first via hole and the second via hole on a surface of the metal structure have an overlapped portion with the metal structure, or orthographic projections of the first portion and the second portion of the active layer on the surface of the metal structure both have overlapped portions with the metal structure.

10. The thin film transistor according to claim 9, further comprising a gate electrode,
wherein the gate electrode is located under the active layer, and the metal structure comprises the gate electrode; or
the gate electrode is located above the active layer, and the metal structure comprises a light-shading metal layer.

11. The thin film transistor according to claim 1, wherein a material of the active layer comprises a metal oxide.

12. An array substrate, comprising the thin film transistor according to claim 1.

13. A display device, comprising the array substrate according to claim 12.

14. A method for manufacturing a thin film transistor, comprising:
forming an active layer;
forming an etch stop layer, wherein the etch stop layer is formed on the active layer and covers at least a portion of the active layer;
forming an overcoating layer, wherein the overcoating layer is formed on the etch stop layer, covers at least a portion of the etch stop layer, and comprises at least one of a conductive material layer, a non-transparent insulation layer and a non-transparent semiconductor layer; and
forming a source electrode and a drain electrode, wherein the source electrode and the drain electrode are formed on the overcoating layer, cover at least a portion of the overcoating layer, and are electrically connected with the active layer by passing through the etch stop layer and the overcoating layer,
wherein the active layer comprises a channel region, and the overcoating layer is disconnected at a position of the channel region of the active layer, and along a direction perpendicular to the overcoating layer, edges of the overcoating layer at the position of the channel region are respectively aligned with an edge of a side of the source electrode facing the drain electrode and an edge of a side of the drain electrode facing the source electrode, so that the overcoating layer and the source electrode/drain electrode have a same profile at the position of the channel region.

15. The method according to claim 14, wherein forming of the etch stop layer and the overcoating layer comprises:
forming an etch stop layer thin film, wherein the etch stop layer thin film is formed on the active layer;
forming an overcoating layer thin film on the etch stop layer thin film;
forming a photoresist thin film on the overcoating layer thin film, and forming a photoresist pattern after exposing and developing the photoresist thin film,
etching the overcoating layer thin film with the photoresist pattern as a mask to form a overcoating layer pattern; and
etching the etch stop layer thin film with the photoresist pattern or the overcoating layer pattern as a mask to form the etch stop layer.

16. The method according to claim 15, wherein forming of the overcoating layer pattern further comprises forming a first overcoating layer via hole and a second overcoating layer via hole in the overcoating layer pattern;
forming of the etch stop layer further comprises forming a first etch stop layer via hole corresponding to the first overcoating layer via hole and a second etch stop layer via hole corresponding to the second overcoating layer via hole in the etch stop layer,
wherein a first via hole is composed of the first overcoating layer via hole and the first etch stop layer via hole, a second via hole is composed of the second overcoating layer via hole and the second etch stop layer via hole, the source electrode is electrically connected with the active layer through the first via hole, and the drain electrode is electrically connected with the active layer through the second via hole.

17. The method according to claim 15, wherein an orthographic projection of the overcoating layer pattern on a surface of the active layer is located in a region where the active layer is provided during forming the overcoating layer pattern; and
the active layer comprises a first portion and a second portion respectively extending beyond edges of two sides of the etch stop layer during forming the etch stop layer; and
wherein the source electrode is electrically connected with the first portion, and the drain electrode is electrically connected with the second portion.

18. The method according to claim 15, wherein the overcoating layer comprises the conductive material layer or the non-transparent semiconductor layer, and the method further comprises:
after forming the etch stop layer, forming a source/drain metal layer thin film on the overcoating layer pattern;
patterning the source/drain metal layer thin film to form the source electrode and the drain electrode; and
etching the overcoating layer pattern to disconnect the overcoating layer pattern at a position between the source electrode and the drain electrode.

19. A method for manufacturing an array substrate, wherein the array substrate comprises a thin film transistor, and
the thin film transistor is formed by the method according to claim 14.

* * * * *